(12) United States Patent
Yeon et al.

(10) Patent No.: US 12,281,383 B2
(45) Date of Patent: Apr. 22, 2025

(54) INDIUM PRECURSOR COMPOUND, METHOD OF PREPARING THIN FILM USING THE SAME, AND BOARD PREPARED USING THE SAME

(71) Applicant: SOULBRAIN CO., LTD., Gyeonggi-do (KR)

(72) Inventors: Chang Bong Yeon, Gyeonggi-do (KR); Jin Hee Kim, Gyeonggi-do (KR); Jae Sun Jung, Gyeonggi-do (KR); Seok Jong Lee, Gyeonggi-do (KR)

(73) Assignee: SOULBRAIN CO., LTD., Gyeonggi-do (KR)

( * ) Notice: Subject to any disclaimer, the term of this patent is extended or adjusted under 35 U.S.C. 154(b) by 0 days.

(21) Appl. No.: 17/773,287

(22) PCT Filed: Oct. 28, 2020

(86) PCT No.: PCT/KR2020/014801
§ 371 (c)(1),
(2) Date: Apr. 29, 2022

(87) PCT Pub. No.: WO2021/086006
PCT Pub. Date: May 6, 2021

(65) Prior Publication Data
US 2024/0167151 A1    May 23, 2024

(30) Foreign Application Priority Data

Oct. 30, 2019  (KR) .................. 10-2019-0136318
Oct. 28, 2020  (KR) .................. 10-2020-0140859

(51) Int. Cl.
*C23C 16/18*   (2006.01)
*C23C 16/40*   (2006.01)
*C23C 16/455*  (2006.01)

(52) U.S. Cl.
CPC ............ *C23C 16/18* (2013.01); *C23C 16/407* (2013.01); *C23C 16/45525* (2013.01)

(58) Field of Classification Search
CPC .. C23C 16/18; C23C 16/407; C23C 16/45525
See application file for complete search history.

(56) References Cited

U.S. PATENT DOCUMENTS

| | | | |
|---|---|---|---|
| 5,235,078 A | 8/1993 | Pohl et al. | |
| 5,874,131 A | 2/1999 | Vaartstra et al. | |
| 2021/0230193 A1* | 7/2021 | Hwang | C23C 16/18 |

FOREIGN PATENT DOCUMENTS

| | | |
|---|---|---|
| EP | 0432574 A2 | 6/1991 |
| EP | 2492272 A1 | 8/2012 |
| EP | 3783002 A1 | 2/2021 |
| JP | 2021517905 A | 7/2021 |
| KR | 10-2011-0020901 A | 3/2011 |
| KR | 10-1221861 B1 | 1/2013 |
| KR | 10-2018-0007815 A | 1/2018 |
| KR | 1020180056949 A | 5/2018 |
| KR | 10-2019-0121468 A | 10/2019 |
| KR | 20190121468 A | 10/2019 |
| WO | 2019203407 A1 | 10/2019 |

* cited by examiner

Primary Examiner — Sikarl A Witherspoon
(74) Attorney, Agent, or Firm — SZDC Law PC

(57) ABSTRACT

The present invention relates to an indium precursor compound, a method of preparing a thin film using the same, and a board prepared using the same. More particularly, the present invention relates to an indium precursor compound represented by Chemical Formula 1, a method of preparing a thin film using the same, and a board prepared using the same.

According to the present invention, a uniform thin film may be formed, productivity may be increased due to an increased deposition rate, thermal stability and storage stability may be excellent, and an effect of easy handling may be obtained.

11 Claims, 1 Drawing Sheet

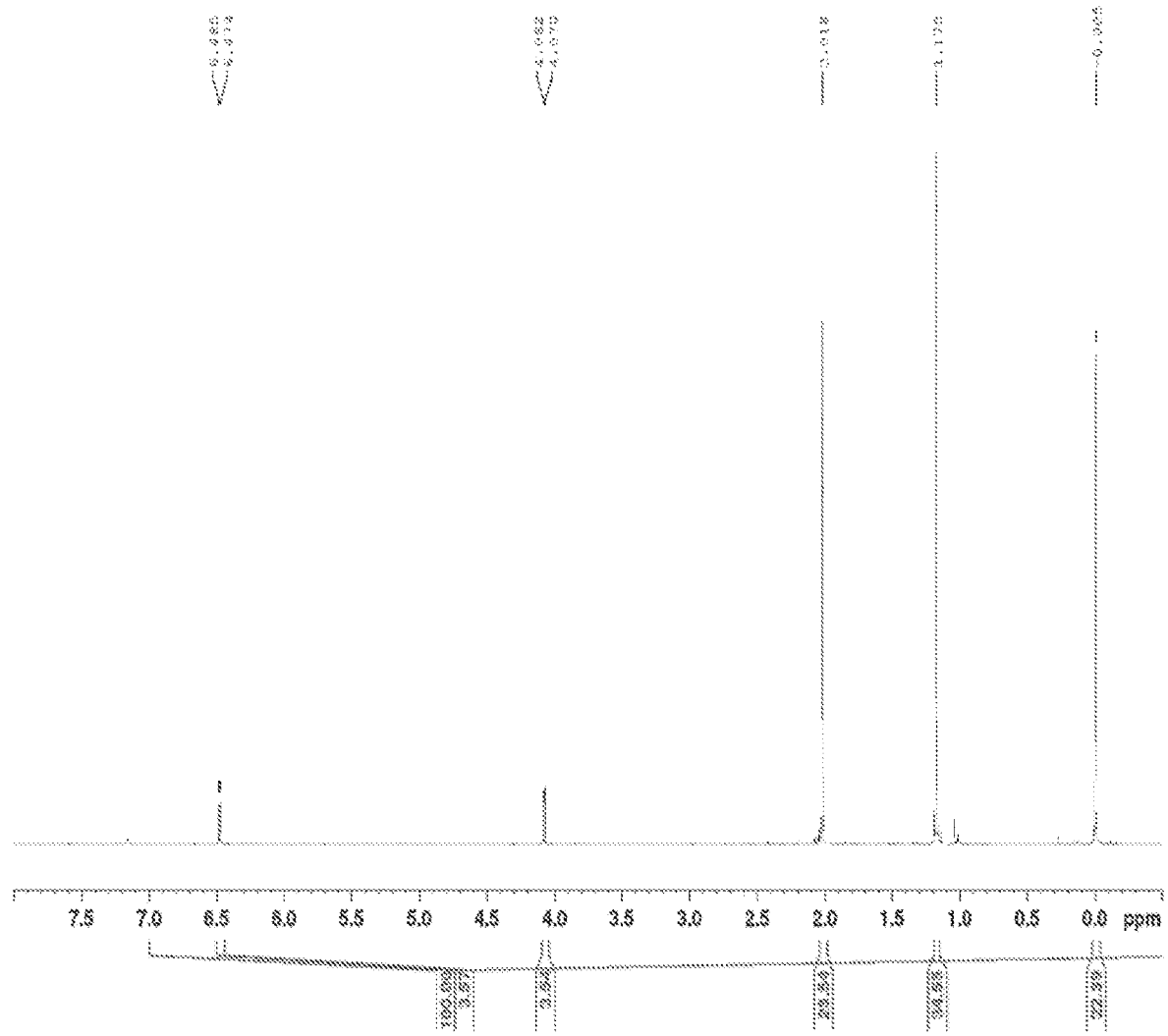

INDIUM PRECURSOR COMPOUND, METHOD OF PREPARING THIN FILM USING THE SAME, AND BOARD PREPARED USING THE SAME

This application is the National Stage Application of PCT/KR2020/014801, filed on Oct. 28, 2020, which claims priority to Korean Patent Application Nos. KR 10-2019-0136318, filed Oct. 30, 2019 and KR 10-2020-0140859, filed Oct. 28, 2020, all of which are incorporated by reference for all purposes as if fully set forth herein.

TECHNICAL FIELD

The present invention relates to an indium precursor compound, a method of preparing a thin film using the same, and a board prepared using the same. More particularly, the present invention relates to an indium precursor compound being capable of forming a uniform thin film by maintaining a constant composition by exhibiting a constant vapor pressure during a deposition process and being capable of increasing productivity by increasing a deposition rate, a method of preparing a thin film using the indium precursor compound, and a board including the thin film prepared using the indium precursor compound.

BACKGROUND ART

Next-generation displays having low power consumption, high resolution, and high reliability are being developed. To manufacture such a display, thin-film transistor (TFT) materials having high charge mobility are required.

Conventionally, amorphous silicon has been used for thin-film transistors. Recently, metal oxides having a higher charge mobility than silicon and being easier to process at low temperatures compared to polycrystalline silicon have been used. As these metal oxides, materials to which various types of metal atoms such as indium and zinc are added are used. Metal oxide thin films are prepared by a process such as sputtering, atomic layer deposition (ALD), pulsed laser deposition (PLD), or chemical vapor deposition (CVD).

Indium is commonly used in transparent electrodes due to excellent transparency and electrical conductivity thereof. As described in KR 2011-0020901 A, when a metal thin film containing indium (In) is formed by sputtering using a sputtering target, since the composition of a deposited thin film is determined by the sputtering target, there is a limit to uniformly controlling the composition of the thin film. In addition, it is difficult to uniformly maintain the composition and thickness of a thin film during large-area deposition, which makes it difficult to obtain uniform film properties.

In addition, in the case of using chemical vapor deposition (CVD) instead of sputtering, since most of previously used indium precursors (e.g., trimethylindium (CAS NO. 3385-78-2)) are solid, there are limitations in terms of vapor pressure control and film quality reproducibility. In particular, most indium (In) precursors are thermally decomposed under high-temperature conditions (250° C. or higher), making it difficult to obtain high-quality thin films. In addition, there is a limitation in obtaining a thin film having a uniform thickness and a uniform multi-component composition during large-area deposition.

Therefore, it is necessary to develop a high-quality indium precursor having excellent thermal stability at high temperatures and being capable of uniform deposition.

RELATED ART DOCUMENTS

Patent Documents

KR 2011-0020901 A

DISCLOSURE

Technical Problem

Therefore, the present invention has been made in view of the above problems, and it is one object of the present invention to provide an indium precursor compound having a high deposition rate, high volatility, and excellent thermal stability and storage stability and being easy to handle.

It is another object of the present invention to provide a method of preparing a thin film including the indium precursor compound and having a uniform thickness, the method being capable of forming a uniform thin film by maintaining a constant composition by exhibiting a constant vapor pressure during a deposition process; and a board including the thin film prepared by the method.

The above and other objects can be accomplished by the present invention described below.

Technical Solution

In accordance with one aspect of the present invention, provided is an indium precursor compound represented by Chemical Formula 1 below:

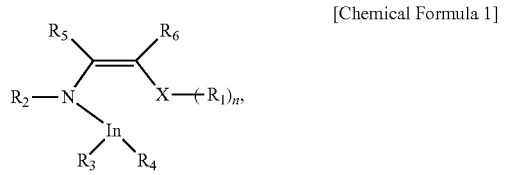

[Chemical Formula 1]

wherein $R_1$, $R_3$, and $R_4$ are each independently a substituted or unsubstituted alkyl group having 1 to 6 carbon atoms, $R_2$ is a linear or branched alkyl group having 1 to 6 carbon atoms, $R_5$ and $R_6$ are each independently hydrogen or an alkyl group having 1 to 3 carbon atoms, X is carbon or a heteroatom, and n is an integer from 1 to 3.

In accordance with another aspect of the present invention, provided is a method of preparing a thin film, the method including a step of depositing the indium precursor compound on a substrate to form a thin film.

In accordance with yet another aspect of the present invention, provided is a board prepared by the method of preparing a thin film.

Advantageous Effects

According to the present invention, the present invention has an effect of providing an indium precursor compound having high volatility and excellent thermal stability and storage stability and being easy to handle; a method of preparing a thin film including the indium precursor compound, the method being capable of forming a uniform thin film by maintaining a constant composition by exhibiting a constant vapor pressure during a deposition process and having high productivity due to a high deposition rate; and a board including the uniform thin film prepared by the method.

DESCRIPTION OF DRAWINGS

FIG. 1 is a graph showing the $^1$H NMR spectrum of a precursor compound prepared according to a synthesis example of the present invention.

BEST MODE

Hereinafter, an indium precursor compound of the present invention, a method of preparing a thin film using the same, and a board prepared using the same will be described in detail.

The terms and words which are used in the present specification and the appended claims should not be construed as being confined to common meanings or dictionary meanings but should be construed as having meanings and concepts matching the technical spirit of the present invention in order to describe the present invention in the best fashion.

In the present invention, when a member is located "on" the other member, this includes not only the case where the member is in contact with the other member but also the case where another member is present between the two members.

In the present invention, it is to be understood that, unless stated otherwise, when a part "includes" any element, the part may include other elements without excluding other elements.

The present inventors confirmed that, when a double bond was included in a ligand of an indium precursor and the ligand was simplified, excellent thermal stability was obtained, and a deposition rate was significantly increased. Based on these results, the present inventors conducted further studies to complete the present invention.

The indium precursor compound of the present invention is represented by Chemical Formula 1 below.

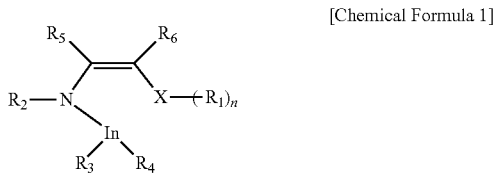

[Chemical Formula 1]

In Chemical Formula 1, $R_1$, $R_3$, and $R_4$ are each independently a substituted or unsubstituted alkyl group having 1 to 6 carbon atoms, $R_2$ is a linear or branched alkyl group having 1 to 6 carbon atoms, $R_5$ and $R_6$ are each independently hydrogen or an alkyl group having 1 to 3 carbon atoms, X is carbon or a heteroatom, and n is a value satisfying the valence of X and is an integer from 1 to 3.

In Chemical Formula 1, X may be, for example, a heteroatom containing an unshared electron pair. For example, the heteroatom containing an unshared electron pair may be N, O, or S, preferably N. In this case, as shown in Chemical Formula 1-1 below, a coordinate covalent bond is formed between indium and the heteroatom due to the unshared electron pair contained in the heteroatom, which stabilizes the indium precursor compound and improves thermal stability and storage stability.

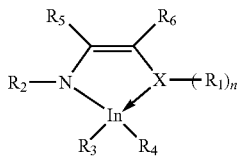

[Chemical Formula 1-1]

For example, when X is nitrogen (N), n may be 2. When X is oxygen (O) or sulfur (S), n may be 1. When X is carbon (C), n may be 3.

In Chemical Formula 1, $R_2$ is a linear or branched alkyl group having 1 to 6 carbon atoms, preferably a branched alkyl group. For example, $R_2$ may be a secondary or tertiary alkyl group, specifically iso-propyl, sec-butyl, iso-butyl, tert-butyl, sec-pentyl, iso-pentyl, tert-pentyl, neo-pentyl, iso-hexyl, sec-hexyl, tert-hexyl, or neo-hexyl. $R_2$ is most preferably iso-butyl, tert-butyl, tert-pentyl, or neo-pentyl. In this case, formation of intermolecular dimers of the indium precursor compound is prevented, thereby further stabilizing a deposition process and strengthening the coordinate covalent bond between the element Xs and indium, thereby further improving the thermal stability and storage stability of the precursor compound.

In Chemical Formula 1, $R_1$, $R_3$, and $R_4$ are each independently a substituted or unsubstituted alkyl group having 1 to 6 carbon atoms, preferably an unsubstituted alkyl group having 1 to 3 carbon atoms. In this case, the stability of the indium precursor compound may be improved, thereby increasing thermal stability and storage stability during a deposition process. In addition, due to molecular simplification, deposition rate may be increased, thereby increasing thin film preparation speed and productivity. In this case, the substituted alkyl group having 1 to 6 carbon atoms means an alkyl group substituted with a substituent such as halogen, oxygen, or nitrogen.

As a preferred example, $R_1$, $R_3$, and $R_4$ may be each independently a methyl group or an ethyl group.

In Chemical Formula 1, $R_5$ and $R_6$ are each independently hydrogen or an alkyl group having 1 to 3 carbon atoms, preferably hydrogen or an alkyl group having 1 or 2 carbon atoms, more preferably hydrogen or a methyl group. In this case, due to molecular simplification, the deposition rate of the indium precursor compound may be further increased, thereby increasing thin film preparation speed and productivity.

As a preferred example, the indium precursor compound may be represented by Chemical Formula 2 below.

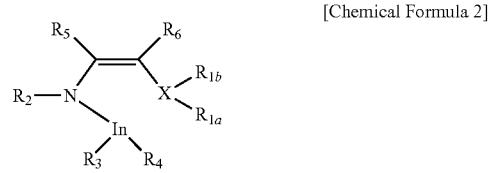

[Chemical Formula 2]

In Chemical Formula 2, $R_2$ to $R_6$ are as defined in Chemical Formula 1, $R_{1a}$ and $R_{1b}$ are each an alkyl group having 1 to 6 carbon atoms, preferably an alkyl group having 1 to 3 carbon atoms, more preferably a methyl group. In this case, due to molecular simplification, the stability of the indium precursor compound may be further improved, thereby increasing thermal stability and storage stability during a deposition process. In addition, deposition rate may be further increased, thereby increasing thin film preparation speed and productivity.

For example, the indium precursor compound may have a vapor pressure of 0.01 to 400 mmHg, preferably 0.01 to 100 mmHg, more preferably 0.01 to 10 mmHg as measured at 25° C. Within this range, when preparing a thin film, vapor pressure may be sufficient during deposition, and deposition rate may be increased.

Known vapor pressure measurement methods commonly practiced in the art to which the present invention pertains may be used in the present invention without particular limitation. As an example, thermogravimetric analysis may be used.

The indium precursor compound of the present invention has excellent volatility as described above and has a sufficient vapor pressure during a thin film forming process. Thus, when a deposition process such as CVD and ALD is performed using the indium precursor compound, process efficiency and the quality of a thin film including the indium precursor compound may be improved.

In the indium precursor compound of the present invention, since a double bond carbon is included in a ligand bonded to indium, the compound may be stabilized, and thus thermal stability may be greatly improved. In addition, storage stability may be improved. In addition, when preparing a thin film, since vapor pressure is kept constant during a deposition process, the composition is kept constant, which enables formation of a uniform thin film. In addition, in the indium precursor compound, when X is a heteroatom containing an unshared electron pair, a coordinate covalent bond may be formed between indium and the element X, thereby further stabilizing the compound. Depending on the type of $R_2$, the effect of stabilizing the compound may be further improved by strengthening the interaction between indium and the element X. Furthermore, compared to a conventional indium precursor for thin film formation, deposition rate may be greatly improved by simplifying a ligand. Thus, when preparing a thin film including the indium precursor compound, the productivity of the thin film may be greatly increased. In addition, compared to other bonds in the compound, the coordinate covalent bond between the element X and indium is relatively easy to break, so that reaction with reactive gas during a thin film formation process may proceed more stably, which facilitates a thin film formation process. In addition, due to the intrinsic chemical stability of the compound, the compound exhibits excellent thermal stability and is not pyrolyzed at temperatures below 200° C. In addition, since the compound has low reactivity at room temperature, the compound does not have a risk of spontaneous ignition, and has the advantage of easy handling.

For example, the indium precursor compound may be prepared by a reaction process as shown in Reaction Formula 1 below.

[Reaction Formula 1]

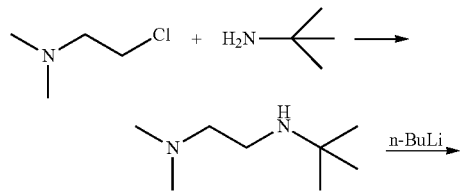

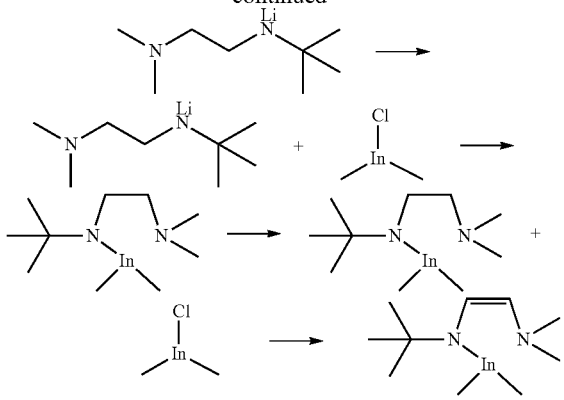

The present invention provides a method of preparing a thin film, the method including a step of depositing the indium precursor compound on a substrate (e.g., wafer) to form a thin film.

According to the method of preparing a thin film of the present invention, by using the indium precursor compound, thermal decomposition may be prevented due to excellent thermal stability, and a constant vapor pressure may be maintained, so that a thin film may be formed stably and uniformly. In addition, productivity may be improved due to an increase in deposition rate.

For example, the method of preparing a thin film may include a step of depositing one or more selected from a gallium precursor and a zinc precursor and the indium precursor compound on a substrate to form a thin film. In this case, it is advantageous to manufacture a transparent electronic device having a uniform multi-component composition and excellent thermal stability.

For example, in the step of forming a thin film, the indium precursor compound, the gallium precursor, and the zinc precursor may be sequentially deposited on a substrate to form a multilayer thin film. As another example, to form a single-layer thin film, the indium precursor compound, the gallium precursor, and the zinc precursor may be simultaneously deposited on a substrate, or a precursor compound prepared by mixing the indium precursor compound, the gallium precursor compound, and the zinc precursor compound may be deposited on a substrate.

For example, the method of preparing a thin film may be performed at a deposition temperature of 200 to 1,000° C. Specifically, the deposition temperature may be 250 to 500° C., preferably 270 to 400° C., more preferably 300 to 350° C. In this case, since the indium precursor compound may be deposited at a relatively low temperature, process efficiency may be improved. In addition, decomposition of compounds used in the deposition process by heat may be suppressed, which greatly improves the stability and productivity of the deposition process.

For example, in the method of preparing a thin film, when necessary, the indium precursor compound, or the indium precursor compound, the gallium precursor, and the zinc precursor may be mixed with a solvent and deposited. For example, the solvent may be an organic solvent. Specifically, the solvent may be one selected from the group consisting of tetrahydrofuran (THF), dimethoxyethane (DME), dichloromethane (DCM), dichloroethane (DCE), benzene, toluene, and mesitylene. In this case, when depositing a thin film, the viscosity or vapor pressure of the precursor compound may be easily adjusted.

For example, the method of preparing a thin film may further include a step of performing deposition using plasma on the thin film formed on the substrate. In this case, a high-quality thin film may be obtained even under deposition conditions at a relatively low temperature. For example, the plasma may be oxygen plasma, without being limited thereto.

The method of preparing a thin film of the present invention may include one or more of the following steps:
  a step of depositing the indium precursor compound of the present invention on a substrate by adsorption;
  a step of purging an unadsorbed indium precursor compound using an inert gas;
  a step of reacting an adsorbed indium precursor compound with a reaction gas by injecting the reaction gas; and
  a step of purging by-products and unreacted materials of the reaction using an inert gas.

In the method of preparing a thin film, for example, assuming that one cycle consists of the above steps, the cycle may be repeated dozens of times or more until a thin film having a desired thickness is formed. Specifically, the number of cycle repetitions may be 50 to 1,000 times, preferably 100 to 300 times. In this case, a thin film having an appropriate thickness may be obtained, and process efficiency may be improved.

As a specific example, the method of preparing a thin film may include the following steps:
  a) a step of loading a substrate into a reaction chamber and maintaining the reaction chamber at a burning temperature;
  b) a first purging step of injecting an inert gas into the reaction chamber;
  c) a step of adsorbing the indium precursor compound of the present invention on the substrate by injecting the indium precursor compound into the reaction chamber;
  d) a second purging step of injecting an inert gas into the reaction chamber to leave the indium precursor compound chemically adsorbed on the substrate and remove the physically adsorbed indium precursor compound;
  e) a step of injecting a reaction gas into the reaction chamber to react the reaction gas with the chemically adsorbed indium precursor compound; and
  f) a third purging step of discharging by-products and unreacted materials of the reaction to the outside of the reaction chamber.

In the method of preparing a thin film, for example, assuming that one cycle consists of steps a) to f), the cycle may be repeated. Specifically, the number of cycle repetitions may be 50 to 1,000 times, preferably 100 to 300 times. In this case, a thin film having an appropriate thickness may be obtained, and process efficiency may be improved.

For example, the method of preparing a thin film may be performed by chemical vapor deposition (CVD), metal organic chemical vapor deposition (MOCVD), low pressure vapor deposition (LPCVD), plasma-enhanced vapor deposition (PECVD), atomic layer deposition (ALD), or plasma-enhanced atomic layer deposition (PEALD), preferably chemical vapor deposition or atomic layer deposition, without being limited thereto. For example, when using chemical vapor deposition or atomic layer deposition, by supplying a gaseous thin film deposition raw material onto the board, a film having a uniform thickness may be formed even on the surface of a structure having a large aspect ratio. In addition, a uniform film may be formed by supplying the indium precursor compound of the present invention at a uniform concentration even onto a large-area or roll-shaped board.

For example, the deposition temperature may be 200 to 1,000° C., specifically 250 to 500° C., preferably 270 to 400° C., more preferably 300 to 350° C. In this case, since the indium precursor compound may be deposited at a relatively low temperature, process efficiency may be improved. In addition, thermal decomposition of compounds used in a deposition process may be suppressed, thereby improving the stability and productivity of the deposition process. In addition, by reducing the content of impurities such as carbon in a prepared thin film, the physical properties of the thin film may be improved.

For example, the deposition may be performed using a time-division deposition apparatus that sequentially supplies and deposits deposition materials.

As another example, a space-division deposition apparatus in which a substrate reciprocates between a space filled with one gaseous raw material and a space filled with another gaseous raw material by rotating the board may be used.

As another example, when the board is a roll-shaped polymer substrate, a roll-to-roll deposition apparatus for winding the substrate in a roll form may be used.

For example, the reaction gas may include one or more selected from the group consisting of water vapor ($H_2O$), hydrogen peroxide ($H_2O_2$), oxygen ($O_2$), ozone ($O_3$), hydrogen ($H_2$), nitrogen ($N_2$), hydrazine ($N_2H_4$), ammonia ($NH_3$), and silane, without being limited thereto.

As a specific example, when the indium precursor compound is deposited in the presence of an oxidizing reaction gas such as water vapor, oxygen, or ozone, an indium-containing metal oxide thin film may be formed.

As another example, when the indium precursor compound is deposited in the presence of a reaction gas such as hydrogen or silane, an indium-containing metal thin film may be formed.

As another example, when the indium precursor compound is deposited in the presence of a nitrogen-based reaction gas such as ammonia or hydrazine, an indium-containing metal nitride thin film may be formed.

In the method of preparing a thin film, the indium precursor compound may be injected, for example, for 1 to 30 seconds, preferably 1 to 20 seconds, more preferably 2 to 10 seconds. Within this range, since the thickness uniformity of a thin film is improved, a uniform thin film may be easily formed even on a board having a complex shape.

In the method of preparing a thin film, the reaction gas may be injected, for example, for 1 to 40 seconds, preferably 1 to 30 seconds, more preferably 2 to 10 seconds. Within this range, the physical properties of the thin film may be improved due to uniform coating properties.

For example, the substrate (for example, wafer) may include one or more selected from the group consisting of glass substrates, silicon substrates, metal polyester (PE) substrates, polyethyleneterephthalate (PET) substrates, polyethylenenapthalate (PEN) substrates, polycarbonate (PC) substrates, polyetherimide (PEI) substrates, polyethersulfone (PES) substrates, polyetheretherketone (PEEK) substrates, and polyimide (PI) substrates, without being limited thereto.

In the present disclosure, a board supplied into a chamber during the thin film preparation process refers to a substrate.

The present invention provides a board including the thin film prepared by the method of preparing a thin film. Here, the board includes a substrate and a thin film formed on the substrate, and the thin film includes the indium precursor compound.

For example, the thin film prepared by the method of preparing a thin film may be an indium oxide thin film, an indium thin film, or an indium nitride thin film. In this case, the thin film may be formed at a high rate, the thin film may be uniformly formed, and thermal stability may be excellent.

For example, the thin film prepared by the method of preparing a thin film may have a single-layer or multilayer structure.

For example, the single-layer thin film may be formed by depositing the indium precursor compound or may be formed by depositing a mixture containing the indium precursor compound and one or more selected from the group consisting of a gallium precursor and a zinc precursor. Preferably, the single-layer thin film is formed by depositing a mixture containing an indium precursor compound and a gallium precursor, a mixture containing an indium precursor compound and a zinc precursor, or a mixture containing an indium precursor compound, a gallium precursor, and a zinc precursor. As a specific example, the gallium precursor and the zinc precursor may be trimethylgallium (TMG) and diethylzinc (DEZ), respectively.

For example, the multilayer thin film may have a laminated structure in which the indium precursor compound and other precursors are sequentially deposited. As a specific example, the multilayer thin film may have a laminated structure in which one or more selected from the group consisting of a gallium precursor and a zinc precursor and the indium precursor compound are deposited on a substrate.

As a specific example, the thin film prepared by the method of preparing a thin film may be an indium gallium zinc oxide (IGZO) thin film. For example, the composition ratio of In:Ga:Zn in the IGZO thin film may be 1 to 10:1 to 10:1 to 10, preferably 1 to 5:1 to 5:1 to 5, more preferably 1:1:1 based on molar ratio.

For example, the thin film prepared by the method of preparing a thin film may have a resistivity value of $1 \times 10^{-5}$ to $1 \times 10^2$ Ωcm, preferably $1 \times 10^{-4}$ to $1 \times 10^2$ Ωcm, more preferably $1 \times 10^{-3}$ to 10 Ωcm at 25° C.

In the present disclosure, known resistivity measurement methods commonly performed in the art to which the present invention pertains may be used in the present invention without particular limitation. As a specific example, a 4-probe method may be used.

Hereinafter, the present invention will be described in more detail with reference to the following preferred examples. However, these examples are provided for illustrative purposes only and should not be construed as limiting the scope and spirit of the present invention. In addition, it will be apparent to those skilled in the art that various changes and modifications may be made without departing from the spirit and scope of the present invention, and such changes and modifications are also within the scope of the appended claims.

EXAMPLE

Synthesis Example 1

Preparation of Indium Precursor Compound

Step 1) 10 g (62.5 mmol) of anhydrous trimethylindium and 200 ml of toluene were placed in a 250 ml Schlenk flask and cooled to −20° C. to prepare a solution. 6.91 g (31.3 mmol) of trichloroindium was slowly added dropwise to the solution, stirred for 30 minutes, and then slowly heated to room temperature and stirred at room temperature. After completion of the reaction, a solvent was removed by applying vacuum at room temperature to obtain 16.91 g (93.8 mmol) of dimethylchloroindium having the same structure as 1-1 of Reaction Formula 2-1 below as a white solid.

$^1$H NMR (C6D6, 400 MHz): δ 0.19 (s, 6H)

[Reaction Formula 2-1]

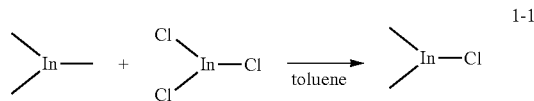

Step 2) 50 g (347.12 mmol) of 2-chloro-N,N-dimethylethylamine hydrochloride and 50 mL of distilled water were place in a 500 mL Schlenk flask and slowly cooled to −20° C. to prepare a solution. 253.88 g (3.47 mol) of tert-butyl amine was slowly added dropwise to the solution, stirred for 30 minutes, and then slowly heated to room temperature and stirred for 1 hour at room temperature. Then, the solution was heated to 80° C., stirred for 1 hour, and then slowly cooled to room temperature. After completion of the reaction, the flask was cooled to −20° C., a solution obtained by diluting 20.83 g (520.68 mmol) of NaOH in 50 mL of distilled water was slowly added dropwise to the flask, and then slowly heated to room temperature and stirred for 1 hour at room temperature. The resulting solution was extracted three times using 150 mL of hexane, and a vacuum of 100 torr was applied to a hexane layer at room temperature to remove hexane. Then, by vacuum distillation, 35 g (242.61 mmol) of N,N-dimethylamino-N'-tert-butylethylene diamine in a colorless liquid state having a structure as shown in 2-1 of Reaction Formula 2-2 below was obtained.

$^1$H NMR (C6D6, 400 MHz): δ 1.06 (s, 9H), 1.21 (br, 1H), 2.06 (s, 6H), 2.33 (t, 2H), 2.56 (q, 2H)

[Reaction Formula 2-2]

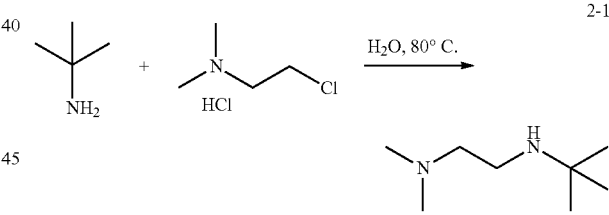

Step 3) 50 mL of toluene was placed in a 250 mL Schlenk flask, 13.86 mL of an n-butyllithium (2.5 M in hexane) solution was added thereto. Then, 5 g (34.66 mmol) of N,N-dimethylamino-N'-tert-butylethylene diamine prepared in step 2) was slowly added dropwise to the flask while cooling the flask to −20° C. Then, the temperature was slowly increased to room temperature, and stirring was performed for 1 hour. The resulting solution was cooled to −20° C., and then 6.25 g (34.66 mmol) of dimethylchloroindium prepared in step 1) was slowly added thereto. Thereafter, the temperature of the flask was slowly increased to room temperature, stirring was performed at room temperature for 1 hour, the temperature was increased to 110° C., stirring was performed for 1 hour, and then the temperature was slowly decreased to room temperature. Thereafter, at room temperature, 6.25 g (34.66 mmol) of dimethylchloroindium prepared in step 1) was slowly added to the flask. Then, the flask was heated to 110° C., stirring was performed at 110° C. for 2 hours, then the flask was slowly cooled to room temperature. After completion of the reaction, solids in the obtained solution were filtered off, and a solvent was removed by applying vacuum to obtain an orange liquid. Then, impurities were removed from the liquid through vacuum distillation to obtain a transparent and colorless compound (precursor for thin film formation) represented by 3-1 of Reaction Formula 2-3 below. As described above, the structure thereof was confirmed by $^1$H NMR spectrum analysis, and the results are shown in FIG. 1 below.

$^1$H NMR (C6D6, 400 MHz): δ −0.01 (s, 6H), 1.17 (s, 9H), 2.02 (s, 6H), 4.08 (d, 1H), 6.48 (d, 1H)

[Reaction Formula 2-3]

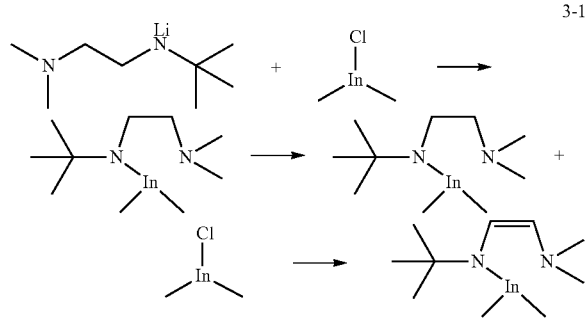

3-1

The prepared indium precursor compound did not ignite or generate fumes even when exposed to the atmosphere, indicating that the indium precursor compound is a stable compound.

The invention claimed is:

1. An indium precursor compound, represented by Chemical Formula 1 below:

[Chemical Formula 1]

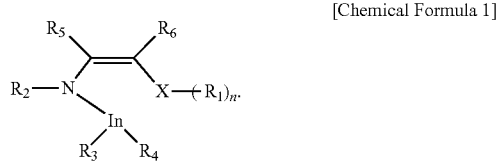

wherein $R_1$, $R_3$, and $R_4$ are each independently a substituted or unsubstituted alkyl group having 1 to 6 carbon atoms, $R_2$ is a linear or branched alkyl group having 1 to 6 carbon atoms, $R_5$ and $R_6$ are each independently hydrogen or an alkyl group having 1 to 3 carbon atoms, X is carbon or a heteroatom, and n is an integer from 1 to 3.

2. The indium precursor compound according to claim 1, wherein, in Chemical Formula 1, X is a heteroatom containing an unshared electron pair.

3. The indium precursor compound according to claim 1, wherein, in Chemical Formula 1, $R_2$ is a branched alkyl group.

4. The indium precursor compound according to claim 1, wherein the indium precursor compound has a vapor pressure of 0.01 to 400 mmHg at 25° C.

5. A method of preparing a thin film, comprising a step of depositing the indium precursor compound according to claim 1 on a substrate to form a thin film.

6. The method according to claim 5, comprising a step of depositing one or more selected from a gallium precursor and a zinc precursor and the indium precursor compound on a substrate to form a thin film.

7. The method according to claim 5, wherein the method is performed at a deposition temperature of 200 to 1,000° C.

8. The method according to claim 5, wherein the deposition is performed by chemical vapor deposition (CVD) or atomic layer deposition (ALD).

9. A board, comprising a substrate; and a thin film formed on the substrate,
wherein the thin film is prepared by the method according to claim 5.

10. The board according to claim 9, wherein the thin film is an indium oxide thin film, an indium thin film, or an indium nitride thin film.

11. The board according to claim 9, wherein the thin film is an indium gallium zinc oxide (IGZO) thin film.

* * * * *